United States Patent
Ren et al.

(10) Patent No.: US 8,906,773 B2
(45) Date of Patent: Dec. 9, 2014

(54) INTEGRATED CIRCUITS INCLUDING INTEGRATED PASSIVE DEVICES AND METHODS OF MANUFACTURE THEREOF

(71) Applicants: Xiaowei Ren, Phoenix, AZ (US); Wayne R. Burger, Phoenix, AZ (US)

(72) Inventors: Xiaowei Ren, Phoenix, AZ (US); Wayne R. Burger, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 51 days.

(21) Appl. No.: 13/712,051

(22) Filed: Dec. 12, 2012

(65) Prior Publication Data

US 2014/0159198 A1    Jun. 12, 2014

(51) Int. Cl.
*H01L 21/20* (2006.01)
*H01L 27/108* (2006.01)

(52) U.S. Cl.
USPC .......................................... 438/396; 257/306

(58) Field of Classification Search
USPC .......... 438/253, 283, 396–399; 257/303–313, 257/E27.019–E27.025
See application file for complete search history.

(56) References Cited

U.S. PATENT DOCUMENTS 6,211,033 B1 *   4/2001   Sandhu et al. ................. 438/387

OTHER PUBLICATIONS

Ng, C.H., et al., "MIM Capacitor Integration for Mixed-Signal/RF Applications", IEEE Transactions on Electron Devices, vol. 52, No. 7, Jul. 2005, pp. 1399-1409.

* cited by examiner

*Primary Examiner* — Calvin Lee
(74) *Attorney, Agent, or Firm* — Sherry W. Schumm

(57) ABSTRACT

Embodiments of integrated passive devices (e.g., metal insulator metal, or MIM, capacitors) and methods of their formation include depositing a composite electrode over a semiconductor substrate (e.g., on a dielectric layer above the substrate surface), and depositing an insulator layer over the composite electrode. The composite electrode includes an underlying electrode and an overlying electrode deposited on a top surface of the underlying electrode. The underlying electrode is formed from a first conductive material (e.g., AlCuW), and the overlying electrode is formed from a second, different conductive material (e.g., AlCu). The top surface of the underlying electrode may have a relatively rough surface morphology, and the top surface of the overlying electrode may have a relatively smooth surface morphology. For high frequency, high power applications, both the composite electrode and the insulator layer may be thicker than in some conventional integrated passive devices.

17 Claims, 7 Drawing Sheets

US 8,906,773 B2

INTEGRATED CIRCUITS INCLUDING INTEGRATED PASSIVE DEVICES AND METHODS OF MANUFACTURE THEREOF

TECHNICAL FIELD

Embodiments of the subject matter described herein relate generally to integrated circuits that include integrated passive devices and methods of their manufacture.

BACKGROUND

Integrated passive devices have been used in complementary metal-oxide-semiconductor (CMOS) integrated circuits for various purposes, including filtering, decoupling, and impedance matching, among other things. For example, various types of capacitors, inductors, transformers, and resistors are commonly integrated into CMOS circuits.

One particular type of integrated passive device is a metal-insulator-metal (MIM) capacitor, which is fairly inexpensive to manufacture and is particularly well suited for many applications. A MIM capacitor essentially includes planar top and bottom metal electrodes separated by a relatively thin layer of insulation. Typically, a portion of a patterned metal layer (e.g., a routing layer) may serve as the bottom electrode of a MIM capacitor, and another conductive material may serve as the top electrode of the MIM capacitor. Contacts to the top and bottom electrodes may be established through another, higher or lower metal layer.

MIM capacitors are relatively easy to incorporate into many integrated circuit designs due to their simple construction and the ability to include portions of existing metal layers in the capacitor design (e.g., for the bottom electrode and the electrode contacts). However, the applicability of conventional MIM capacitors to relatively high frequency and/or relatively high power applications is limited, in that conventional MIM capacitors tend to have relatively low breakdown voltages and relatively high leakage currents. Other types of standard integrated passive devices also may have limited applicability to relatively high frequency and/or high power applications. Accordingly, what are needed are MIM capacitors and other integrated passive devices that exhibit acceptable performance when used in relatively high frequency and/or high power applications.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
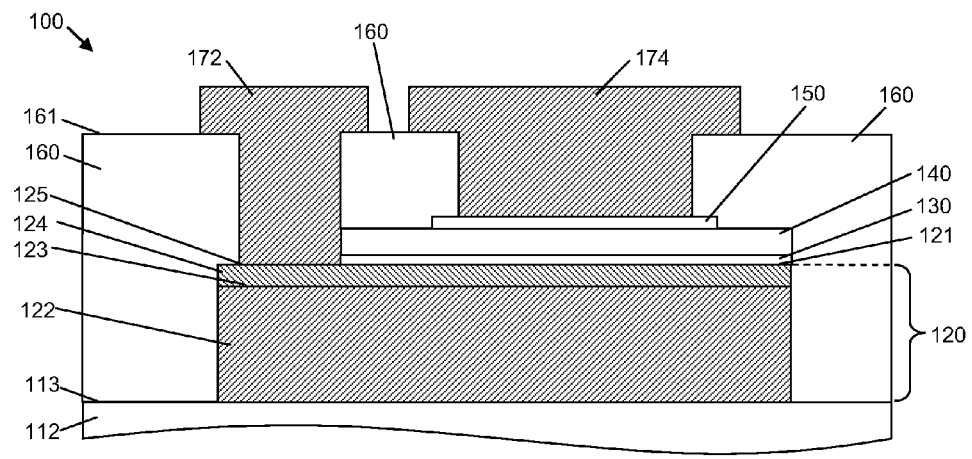
FIG. 1 is a cross-sectional, side view of a metal-insulator-metal (MIM) capacitor, in accordance with an example embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Example embodiments discussed herein include integrated passive devices having characteristics that make them particularly well suited for high frequency and/or high power applications. However, it is to be understood that the various embodiments also may be used in conjunction with relatively low frequency and/or low power applications, as well, and various modifications may be made to the embodiments to better suit them for such low frequency and/or low power applications. Further, although the Figures and description primarily focus on a particular type of integrated passive device, specifically a metal-insulator-metal (MIM) capacitor, it is to be understood that various features of the inventive subject matter also may be applied in the construction of other types of integrated passive devices (e.g., inductors, transformers, resistors, and so on), which various modifications that are intended to fall within the scope of the inventive subject matter. For example, whereas embodiments of MIM capacitors described herein include a "composite" metal bottom electrode, a different type of integrated passive device may include a different composite metal feature (e.g., a composite metal coil, resistive strip, and so on).

As discussed previously, a MIM capacitor essentially consists of top and bottom metal electrodes separated by a layer of insulation. Embodiments of MIM capacitors described herein are well suited for relatively high power and high frequency applications (e.g., applications in which the MIM capacitor is integrated with a radio frequency (RF) power transistor for impedance matching or other purposes). More particularly, various MIM capacitor embodiments include a relatively thick bottom electrode that is configured to meet low resistance requirements and stringent electromigration constraints, which are characteristic of high power and high frequency applications. For example, as will be described in more detail below, MIM capacitor embodiments described herein include a bottom electrode that may be two or more times thicker than the thicknesses of other conventional MIM capacitors, so that the bottom electrode has a relatively low resistance. More particularly, whereas a conventional MIM capacitor may have a bottom electrode with a thickness of about 0.6 microns, an example MIM capacitor embodiment may have a composite bottom electrode with a thickness in a range of about 1.0 to about 2.0 microns (e.g., about 1.5 microns), although embodiments of MIM capacitors may have thicker or thinner composite bottom electrodes, as well. In addition, in an embodiment, the bulk of the bottom electrode is formed from a material (e.g., aluminum copper tungsten) that meets stringent electromigration constraints.

Embodiments of MIM capacitors discussed herein each include a "composite" bottom electrode (e.g., composite bottom electrode 120, FIG. 1), which is formed from portions of a composite metal layer (e.g., a metal layer that includes an underlying metal layer and an overlying metal layer). As discussed briefly above, to make the MIM capacitor particularly well suited for relatively high frequency, high power applications, an example MIM capacitor embodiment includes a composite bottom electrode that is significantly thicker than the bottom electrodes of conventional MIM capacitors. For example, the composite bottom electrode may be formed from portions of at least two metal layers, including a relatively thick underlying layer (e.g., underlying metal layer 422, FIG. 4) and a relatively thin overlying metal layer (e.g., overlying layer 524, FIG. 5) formed on the surface of the underlying layer. According to an embodiment, the underlying metal layer is formed from a material having more favorable electromigration properties than the electrode metals used for some conventional MIM capacitors, which makes the MIM capacitor embodiments particularly well suited for high power, high frequency applications. For example, an example MIM capacitor embodiment may use aluminum copper tungsten (AlCuW) for the underlying metal layer of a composite bottom electrode, although other materials may be used, as well. The overlying metal layer is formed from a different material, in an embodiment. For example, an example MIM capacitor embodiment may use aluminum copper (AlCu) for the overlying metal layer of a composite bottom electrode, although other materials may be used, as well.

Due to its thickness, deposition temperature, and/or material characteristics, the underlying metal layer (e.g., of AlCuW) may have a relatively rough surface morphology (e.g., a relatively large grain structure at the top surface of the underlying layer). In contrast, the overlying metal layer (e.g., of AlCu) may have a relatively smooth surface morphology. Accordingly, by depositing the overlying metal layer on top of the underlying metal layer in accordance with the various embodiments, the overall surface morphology of the composite bottom electrode (i.e., the surface morphology of the overlying metal layer) may be significantly smoother than the surface morphology of the underlying metal layer taken alone. This may improve the reliability of a MIM capacitor fabricated using the composite bottom electrode.

In addition to including a relatively thick bottom electrode, embodiments of MIM capacitors described herein include a relatively thick layer of insulation (e.g., insulator layer 140, FIG. 1) between the top and bottom metal electrodes. In general, the breakdown voltage of a MIM capacitor increases with increasing insulator thickness. For example, a conventional MIM capacitor with an insulator layer that is about 100 angstroms (Å) to about 500 Å thick may result in a device with a breakdown voltage of about 10 volts to about 50 volts, which is acceptable for many applications. In contrast, an example MIM capacitor embodiment may have an insulator layer with a thickness in a range of about 1500 Å to about 2500 Å, resulting in a device with a breakdown voltage in a range of about 150 volts to about 250 volts. Accordingly, example MIM capacitor embodiments disclosed herein may be better suited for high voltage applications with stringent reliability requirements (e.g., time-dependent dielectric breakdown (TDDB) requirements).

The insulation layer is formed at a temperature that is lower than the melting temperature of the bottom electrode (e.g., less than about 500 degrees Celsius, in an embodiment). Some materials used for insulator layers in a MIM capacitor are known to be relatively brittle, making the robustness of the materials particularly sensitive to the morphology of the surfaces over which they are deposited. This sensitivity to surface morphology typically increases with increasing insulator thickness and higher operational voltages. By including a composite bottom electrode with a relatively smooth surface morphology, a relatively thick yet robust insulator layer may be included in the various example embodiments of MIM capacitors described herein. Accordingly, for the various reasons discussed above, embodiments of MIM capacitors described herein may be better suited than conventional MIM capacitors for high frequency, high power applications, while being reasonably robust, easy to manufacture, and inexpensive.

FIG. 1 is a cross-sectional, side view of a MIM capacitor 100, in accordance with an example embodiment. As will be discussed in more detail later, MIM capacitor 100 may form a portion of an integrated circuit device (e.g., integrated circuit device 1200, FIG. 12). More particularly, MIM capacitor 100 may be constructed above a semiconductor substrate (e.g., semiconductor substrate 300, FIG. 12), with various dielectric and metal layers (e.g., patterned metal layers 304, 308 and dielectric layers 306, 310, 312, FIG. 12) intermediate a top surface of the semiconductor substrate and MIM capacitor 100, where the dielectric and metal layers provide a routing and interconnect structure for the integrated circuit device. Through various interconnections (e.g., routing traces formed from metal layers 304, 308, 520, 1170 and vias 322, 324, 1202, 1204, FIG. 12), the MIM capacitor 100 may be electrically connected with other components (e.g., component 302, FIG. 12) of the integrated circuit device, to form an active or passive circuit. Accordingly, although MIM capacitor 100 and embodiments of its manufacturing method are discussed in isolation, it is to be understood that MIM capacitor 100 may be integrally formed and interconnected with other portions of an integrated circuit device.

MIM capacitor 100 includes a composite bottom electrode 120, an insulator layer 140, and a top electrode having a shape defined by a top electrode plate 150, in an embodiment, all of which are formed over a first dielectric layer 112 of an integrated circuit device. In addition, in an embodiment, MIM capacitor 100 may include a cap layer 130 between the top surface 121 of the composite bottom electrode 120 and the bottom surface of the insulator layer 140. Bottom and top electrode contacts 172, 174 deposited in openings in a second dielectric layer 160 provide for electrical connectivity to the bottom electrode 120 and the top electrode plate 150, respectively.

Composite bottom electrode 120 is deposited over (e.g., on) a top surface 113 of the first dielectric layer 112. The first dielectric layer 112 may be any of multiple dielectric layers of a routing and interconnect structure formed over the surface of a semiconductor substrate, according to various embodiments. Alternatively, the first dielectric layer 112 may be some other layer of insulating material, which is not specifically a portion of the routing interconnect structure, or MIM capacitor 100 may be formed directly on the surface of a semiconductor structure. However, when MIM capacitor 100 is included in a circuit designed for high frequency applications (e.g., RF frequencies), it may be desirable to form MIM capacitor 100 some distance above the semiconductor substrate interface in order to reduce the coupling between MIM capacitor 100 and the substrate and/or underlying circuits (e.g., with several dielectric and metal layers of a routing and interconnect structure between the MIM capacitor and the top surface of the semiconductor substrate).

According to an embodiment, the composite bottom electrode 120 includes an underlying electrode 122 and an overlying electrode 124, formed from portions of an underlying metal layer (e.g., underlying metal layer 422, FIG. 4) and an overlying metal layer (e.g., overlying metal layer 524, FIG. 5), respectively. Collectively, the underlying metal layer and overlying metal layer (e.g., composite metal layer 520, FIG. 5), once patterned, may constitute a routing layer of the routing and interconnect structure of the integrated circuit device. For example, the underlying and overlying metal layers may constitute one of the M1, M2, M3, M4, M5, or a higher layer of a routing and interconnect structure of the integrated circuit device.

The underlying electrode 122 is formed on a top surface 113 of the first dielectric layer 112, and the overlying electrode 124 is formed on a top surface 123 of the underlying electrode 122, in an embodiment. The underlying electrode 122 is formed from a first conductive material which has relatively good electromigration properties. For example, the first conductive material is or includes aluminum copper tungsten (AlCuW), in an embodiment. In an alternate embodiment, the first conductive material may be another conductive material with good electromigration properties. The overlying electrode 124 is formed from a second conductive material which has a relatively smooth surface morphology, and the second conductive material may be different from the first conductive material. For example, the second conductive material is or includes aluminum copper (AlCu), in an embodiment. In an alternate embodiment, the second conductive material may be another conductive material with a relatively smooth surface morphology.

The total thickness of the composite bottom electrode 120 may be substantially thicker than the thickness of a typical routing layer or bottom electrode of many conventional MIM capacitors, in an embodiment. For example, the total thickness of the composite bottom electrode 120 may be in a range of about 1.0 to about 2.0 microns (e.g., about 1.5 microns), although the composite bottom electrode 120 may be thicker or thinner, as well. According to an embodiment, the thickness of the underlying electrode 122 is relatively large, when compared with a thickness of the overlying electrode 124. For example, the thickness of the underlying electrode 122 may be in a range of about 85 percent to about 95 percent of the total thickness of the composite bottom electrode 120, in an embodiment (e.g., the thickness of the overlying electrode 124 may be in a range of about 5 percent to about 15 percent of the total thickness of the composite bottom electrode 120). Alternatively, the thickness of the underlying electrode 122 may be a greater or lesser percentage of the total thickness of the composite bottom electrode 120. More specifically, according to an embodiment, the underlying electrode 122 has a thickness in a range of about 1.0 microns to about 2.0 microns, and the overlying electrode 124 has a thickness in a range of about 0.1 microns to about 0.3 microns.

According to an embodiment, the top surface 123 of the underlying electrode 122 may have a relatively rough morphology (e.g., a relatively large grain structure). In contrast, the top surface 125 of the overlying electrode 124 may have a relatively smooth morphology (e.g., a relatively small grain structure). Accordingly, the overall surface morphology of the composite bottom electrode 120 (i.e., the surface morphology of the overlying electrode 124) may be smoother than the surface morphology of just the underlying electrode 122. For example, the surface morphologies of the underlying and overlying electrodes 122, 124 may be quantified by the saturation value of their surface widths, their correlation lengths, and/or other quantities representative of surface roughness. According to an embodiment, the roughness of the surface of the underlying electrode 122 may be about 25 percent or greater than the roughness of the surface of the overlying electrode 124, however that roughness is quantified. Alternatively, the surface of the underlying electrode 122 may not be as rough, when compared with the surface of the overlying electrode 124.

According to an embodiment, MIM capacitor 100 also includes cap layer 130 formed on the top surface 125 of the overlying electrode 124 (i.e., on the top surface 121 of the composite bottom electrode 120). Cap layer 130 may be useful in the particular integration scheme, and may improve the reliability of MIM capacitor 100 (e.g., by providing a stable metallurgical layer). In an alternate embodiment, cap layer 130 may be excluded. Desirably, cap layer 130 is formed from a material with good electromigration properties, in an embodiment. Cap layer 130 may be formed from a single layer of material or from multiple layers of material. For example, according to a particular embodiment, cap layer 130 may include one or more layers of titanium (Ti) and one or more layers of titanium nitride (TiN). Alternatively, cap layer 130 may be formed from other materials or may be excluded altogether. Cap layer 130 has a thickness in a range of about 0.02 microns to about 0.08 microns, in an embodiment, although cap layer 130 may be thicker or thinner, as well.

Insulator layer 140 is deposited over the composite bottom electrode 120 (e.g., on cap layer 130, when it is included). According to an embodiment, insulator layer 140 is formed from a material having a relatively high dielectric constant, such as a plasma enhanced nitride or a plasma enhanced oxide, although insulator layer 140 may be formed from other materials, as well. The thickness of the insulator layer 140 is sufficient to provide a desired breakdown voltage for the MIM capacitor 100. For example, insulator layer 140 has a thickness in a range of about 1500 Å to about 2500 Å (e.g., about 2000 Å), so that MIM capacitor 100 has a breakdown voltage significantly higher than a typical MIM capacitor (e.g., a MIM capacitor with a breakdown voltage of about 10 volts). Insulator layer 140 may be thicker or thinner than the above-given range, as well.

MIM capacitor 100 further includes a top electrode formed over the insulator layer 140 (e.g., on the top surface of the insulator layer 140). The shape of the top electrode may be defined, for example, by a relatively thin top electrode plate 150. For example, the top electrode plate 150 may be formed from a single layer of material or from multiple layers of material. For example, according to a particular embodiment, top electrode plate 150 may include a single layer of titanium nitride (TiN). Alternatively, top electrode plate 150 may be formed from one or more layers of other materials. Top electrode plate 150 has a thickness in a range of about 0.2 microns to about 0.3 microns, in an embodiment, although top electrode plate 150 may be thicker or thinner, as well. Along with defining the shape of the top electrode, the top electrode plate 150 may function to protect the insulator layer 140 during fabrication of the MIM capacitor 100 (e.g., during etch), as will be explained in more detail later. In an alternate embodiment, the top electrode plate 150 may be excluded, and the top electrode contact 174 may function as the top electrode. As it is desirable to include the top electrode plate 150 at least for the purposes of providing an etch stop, the top electrode plate 150 may be referred to simply as the "top electrode," herein.

Second dielectric layer 160 is formed over and adjacent various portions of MIM capacitor 100. For example, second dielectric layer 160 may constitute a dielectric layer of the routing and interconnect structure of the integrated circuit device (e.g., a dielectric layer between two metal routing layers of the routing and interconnect structure). According to an embodiment, the second dielectric layer 160 includes first portions, which extend from a top surface 161 of the second dielectric layer 160 to a top surface 113 of the underlying, first dielectric layer 112. The first portions of the second dielectric layer 160 function to electrically isolate the MIM capacitor 100 from adjacent devices and features of the integrated circuit device. In addition, the second dielectric layer 160 includes a second portion, which extends from the top surface 161 of the second dielectric layer 160 to top surfaces of the top electrode plate 150 and the insulator layer 140. The second portion of the second dielectric layer 160 functions to electrically isolate the bottom and top electrode contacts 172, 174 from each other.

Figure 10:
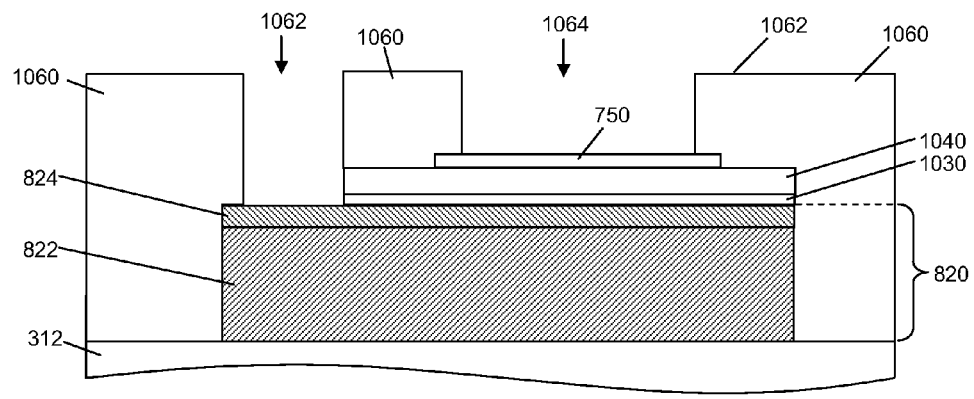
Figure 11:
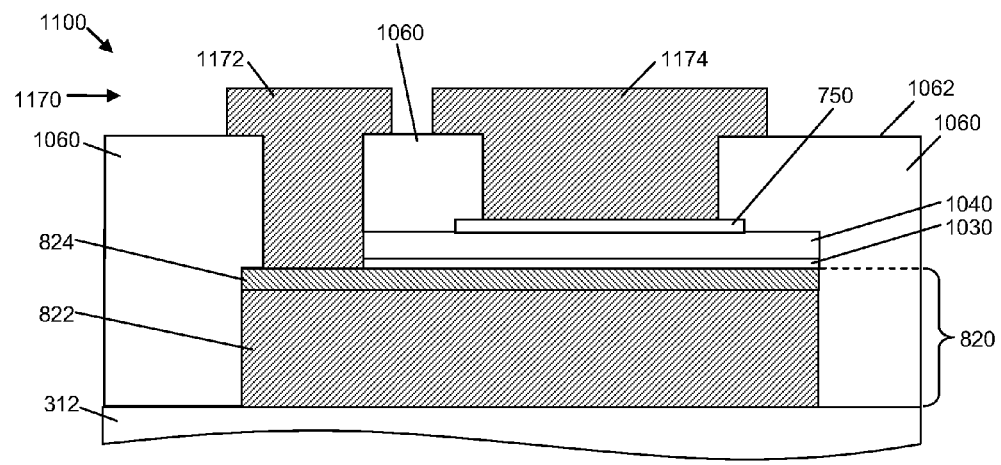

More particularly, the second dielectric layer 160 includes at least two openings (e.g., openings 1062, 1064, FIG. 10) within which the bottom and top electrode contacts 172, 174 are formed. The bottom electrode contact 172 extends through the second dielectric layer 160, the insulator layer 140, and the cap layer 130 (when included) to the top surface 121 of the composite bottom electrode 120, in an embodiment. In an alternate embodiment, a portion (not illustrated) of cap layer 130 may be present between the bottom electrode contact 172 and the composite bottom electrode 120. The top electrode contact 174 extends through the second dielectric layer 160 to the top electrode plate 150. Accordingly, the bottom and top electrode contacts 172, 174 provide electrical connectivity to the bottom and top electrodes, respectively. The metal layer from which the top and bottom electrode contacts 172, 174 are formed may be relatively thick (e.g., in a range of about 3 microns to about 4 microns, or some other thickness).

According to an embodiment, the bottom and top electrode contacts 172, 174 form portions of a metal layer of a routing and interconnect structure of the integrated circuit device. For example, the bottom and top electrode contacts 172, 174 may constitute portions of one of the M2, M3, M4, M5, or a higher layer of a routing and interconnect structure of the integrated circuit device. As a more specific example, MIM capacitor 100 may be formed from portions of the M4 and M5 layers, and their intermediate dielectric layer. More particularly, the composite bottom electrode 120 may be formed from a portion of the M4 layer, the top and bottom electrode contacts 172, 174 may be formed from portions of the M5 layer, and the second dielectric layer 160 may be formed from portions of the dielectric layer between the M4 and M5 layers. Alternatively, the composite bottom electrode 120 and the top and bottom electrode contacts 172, 174 may be formed from portions of lower or higher metal layers.

Although electrode contacts 172, 174 may be implemented using non-filled, vertical via structures, as shown in the Figures, either or both of the electrode contacts 172, 174 could be implemented using a different type of interconnect structure, in another embodiment. For example, either or both of the electrode contacts 172, 174 could be implemented using a tapered non-filled via, a plug-filled via (e.g., a tungsten-plug (W-plug) filled via), a stacked via structure, and/or another type of interconnect structure. In addition, although the Figures indicate that electrical connectivity to the bottom electrode 120 and the top electrode plate 150 may be made using interconnections with a higher metal layer, in still other alternate embodiments, electrical connectivity to the bottom electrode 120 (or to both the bottom electrode 120 and the top electrode plate 150) may be made using interconnections with lower metal layers.

Figure 2:
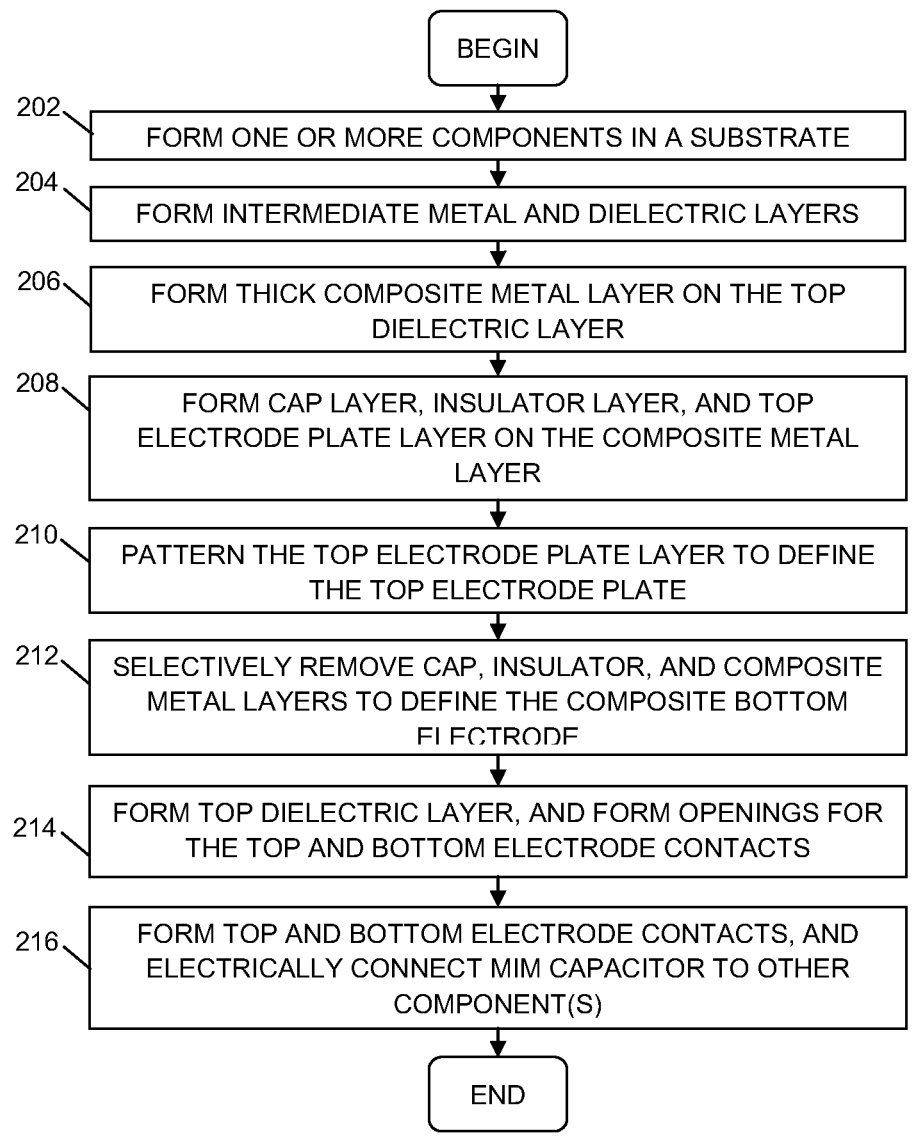
FIG. 2 is a flowchart of a method of manufacturing an integrated circuit device that includes one or more MIM capacitors and/or other integrated passive devices, in accordance with an example embodiment.

FIG. 2 is a flowchart of a method of manufacturing an integrated circuit device that includes one or more MIM capacitors and/or other integrated passive devices, in accordance with an example embodiment. FIG. 2 should be viewed in parallel with FIGS. 3-11, which are cross-sectional, side views of a portion of an integrated circuit device during the steps of the manufacturing process of FIG. 2, in accordance with an example embodiment.

Figure 3:
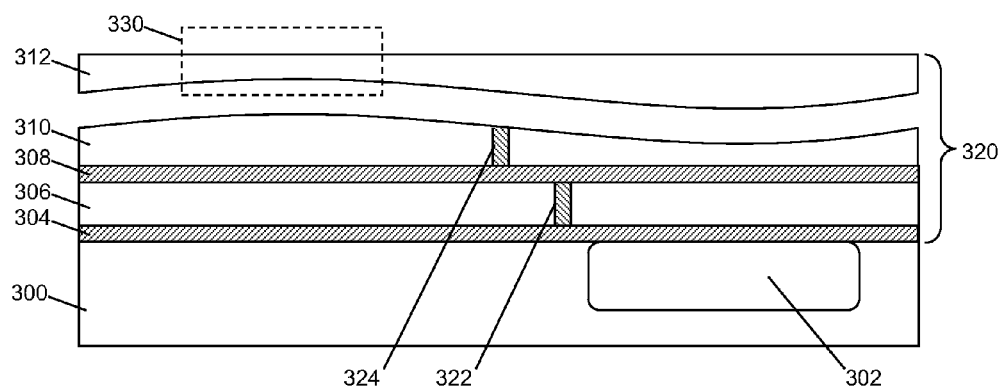
FIGS. 3-11 are cross-sectional, side views of a portion of an integrated circuit device during the steps of the manufacturing process of FIG. 2, in accordance with an example embodiment.

Referring to both FIG. 2 and FIG. 3, the method may begin, in block 202, by providing a semiconductor substrate 300, and forming one or more components 302 in the semiconductor substrate 300. For example, the semiconductor substrate 300 may include a silicon substrate, a gallium arsenide substrate, a gallium nitride substrate, or another type of semiconductor substrate. The semiconductor substrate 300 may be formed from a single crystal, or may include an epitaxially-formed crystalline overlayer, in various embodiments. The epitaxial layer may be formed directly on a semiconductor substrate, or may be formed over an insulator layer on the semiconductor substrate (e.g., as in a silicon-on-insulator substrate).

According to an embodiment, one or more components (e.g., transistors, diodes, and so on) may be formed in the semiconductor substrate 300. For example, but not by way of limitation, the one or more components 302 may include one or more transistors formed at the surface of the semiconductor substrate 300. The transistors may include metal oxide semiconductor (MOS) transistors and/or bipolar junction transistors, in various embodiments. According to a specific embodiment, the transistors include either or both p-channel and/or n-channel, laterally diffused, MOS transistors (LDMOS) designed for high power operation at radio frequencies (e.g., the transistor is a high power, RF LDMOS transistor).

In block 204, one or more metal layers 304, 308 and dielectric layers 306, 310, 312 are formed over (e.g., on the surface of) the semiconductor substrate 300, along with vias 322, 324, which electrically connect the metal layers 304, 308. For example, the metal and dielectric layers 304, 306, 308, 310, 312 may form a routing and interconnect structure 320 overlying the semiconductor substrate 300. The routing and interconnect structure 320, once completed, provides electrical connections between the various components of the integrated circuit device (e.g., component 302 and MIM capacitor 1100, FIG. 11), and ultimately with external circuitry. As will be illustrated and described in more detail in conjunction with FIGS. 4-12, one or more MIM capacitors (e.g., MIM capacitor 1100, FIG. 11) may be formed over one or more portions (e.g., portion 330) of a top dielectric layer 312 of the routing and interconnect structure 320, in an embodiment. FIGS. 4-11 illustrate enlarged, cross sectional views of various stages of manufacture of a MIM capacitor (e.g., MIM capacitor 1100, FIGS. 11, 12) at portion 330 of an integrated circuit device. Prior to forming the MIM capacitor, one or more via openings may be formed in dielectric layer 312 of the routing and interconnect structure 320, to enable electrical connectivity between the MIM capacitor and underlying metal layers (e.g., through via 1204, FIG. 12).

Figure 4:
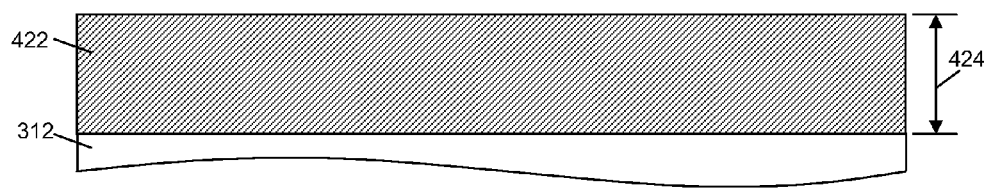
Figure 5:
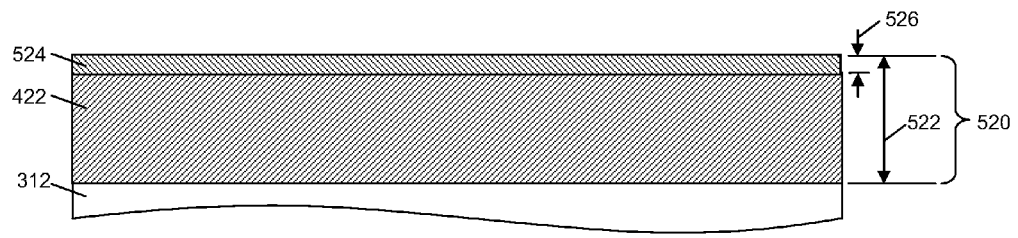

Referring to FIGS. 2, 4, and 5, in block 206, a composite metal layer 520 (FIG. 5) is formed over (e.g., on the surface of) dielectric layer 312 of the routing and interconnect structure 320. As discussed previously, the composite metal layer 520, once patterned, may constitute a metal routing layer of the device's routing and interconnect structure (e.g., one of metal layers M1, M2, M3, M4, M5 or higher). Forming the composite metal layer 520 includes first forming a relatively thick, underlying metal layer 422 over (e.g., on the surface of) dielectric layer 312, and subsequently forming a relatively thin, overlying metal layer 524 on the surface of the underlying metal layer 422. One or more vias (e.g., via 1204, FIG. 12) to underlying metal layers may be formed in via openings (not illustrated) in dielectric layer 312 during formation of the underlying metal layer 422, in an embodiment.

The underlying metal layer 422 is formed from a first conductive material, and the overlying metal layer 524 is formed from a second conductive material which, in an embodiment, is different from the first conductive material. For example, the first conductive material is or includes AlCuW, and the second conductive material is or includes AlCu, in an embodiment. In an alternate embodiment, the first and/or second conductive materials may be or include other materials. The underlying metal layer 422 may have a relatively rough surface morphology, and the overlying metal layer 524 may have a relatively smooth surface morphology, when compared with each other, as discussed previously.

The total thickness 522 of the composite metal layer 520 may be in a range of about 1.0 to about 2.0 microns (e.g., about 1.5 microns), in an embodiment, although the composite metal layer 520 may be thicker or thinner, as well. According to an embodiment, the thickness 424 of the underlying metal layer 422 is relatively large, when compared with a thickness 526 of the overlying metal layer 524. For example, the thickness 424 of the underlying metal layer 422 may be in a range of about 85 percent to about 95 percent of the total thickness 522 of the composite metal layer 520, in an embodiment (e.g., the thickness of the overlying metal layer 524 may be in a range of about 5 percent to about 15 percent of the total thickness 522 of the composite metal layer 520). Alternatively, the thickness 424 of the underlying metal layer 422 may be a greater or lesser percentage of the total thickness 522 of the composite metal layer 520. According to an embodiment, the underlying metal layer 422 has a thickness in a range of about 1.0 microns to about 2.0 microns, and the overlying metal layer 524 has a thickness in a range of about 0.1 microns to about 0.3 microns.

Figure 6:
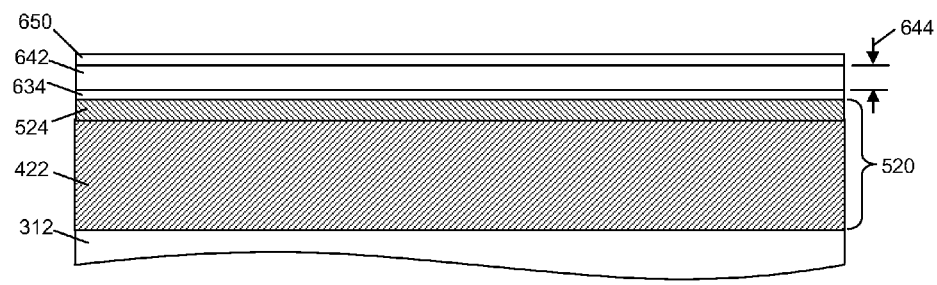

Referring to FIGS. 2 and 6, in block 208, a cap layer 634, an insulator layer 642, and a top electrode plate layer 650 are formed over (e.g., on the surface of) the composite metal layer 520, in an embodiment. Cap layer 634 may be formed from a single layer of material or from multiple layers of material. For example, according to a particular embodiment, cap layer 634 may include one or more layers of Ti and one or more layers of TiN. Alternatively, cap layer 634 may be formed from other materials or may be excluded altogether. Cap layer 634 has a thickness in a range of about 0.02 microns to about 0.08 microns, in an embodiment, although cap layer 634 may be thicker or thinner, as well. In an alternate embodiment, cap layer 634 may be excluded. Insulator layer 642 may be formed from a plasma enhanced nitride or a plasma enhanced oxide, according to various embodiments, although insulator layer 642 may be formed from other materials, as well. According to an embodiment, insulator layer 642 has a thickness 644 in a range of about 1500 Å to about 2500 Å (e.g., about 2000 Å), although insulator layer 642 may be thicker or thinner than the above-given range, as well. Top electrode plate layer 650 may be formed from a single layer of material or from multiple layers of material. For example, according to a particular embodiment, top electrode plate layer 650 may include a single layer of TiN. Alternatively, top electrode plate layer 650 may be formed from one or more layers of other materials. Top electrode plate layer 650 has a thickness in a range of about 0.2 microns to about 0.3 microns, in an embodiment, although top electrode plate layer 650 may be thicker or thinner, as well. Top electrode plate layer 650 may be formed from a single layer of material or from multiple layers of material. For example, according to a particular embodiment, top electrode plate layer 650 may include a single layer of TiN. Alternatively, top electrode plate layer 650 may be formed from one or more layers of other materials.

Figure 7:
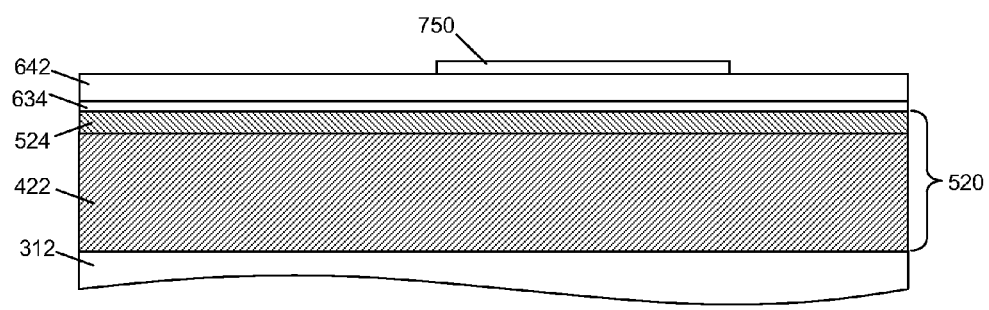

Referring to FIGS. 2 and 7, the top electrode plate layer 650 is patterned to define the shape of the top electrode, in block 210. For example, the patterning process may include forming a top electrode plate 750 by masking a portion of the top electrode plate layer 650 (e.g., using photoresist) corresponding to the top electrode plate 750, and selectively etching the unmasked portion of the top electrode plate layer 650. In other embodiments, other methods of forming the top electrode plate 750 may be used (e.g., selective deposition of the top electrode plate 750, rather than selective removal of portions of the top electrode plate layer 650).

Figure 8:
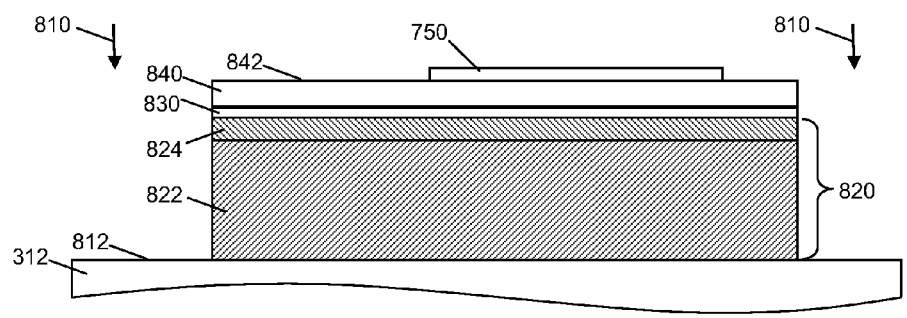
Figure 9:
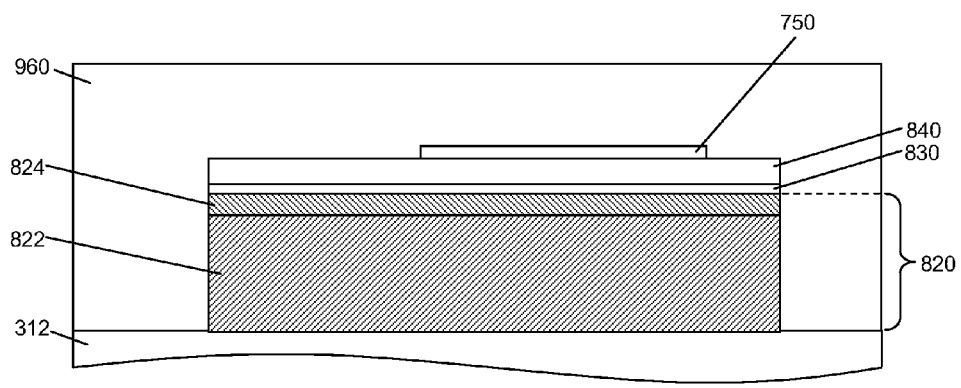

Referring to FIGS. 2, 7, and 8, a composite bottom electrode 820 is formed, in block 212, by selectively removing portions of the underlying metal layer 422, the overlying metal layer 524, the cap layer 634, and the insulator layer 642. For example, the process of forming the composite bottom electrode 820 may include masking the top electrode plate 750 and a portion of the insulator layer 642 (e.g., using photoresist), where the masked portions correspond to the shape of the composite bottom electrode 820, and selectively etching the unmasked portions of the insulator layer 642, cap layer 634, overlying metal layer 542, and underlying metal layer 422. The etching process may be terminated at dielectric layer 312 of the routing and interconnect structure (e.g., structure 320, FIG. 3), so that the process results in openings 810 that extend from a top surface 842 of the insulator layer 642 to a top surface 812 of dielectric layer 312. In addition, the process defines the shape of the composite bottom electrode 820, which includes an underlying electrode 822 and an overlying electrode 824, in an embodiment. The shapes of the cap layer 830 and insulator layer 840 also may be defined during the etching process. In other embodiments, other methods of defining the shapes of the composite bottom electrode 820, the cap layer 830, and the insulator layer 840 may be used (e.g., multiple masking and etching processes selective to the materials of the various layers).

Referring to FIGS. 2, 8, 9, and 10, in block 214, dielectric layer 960 is deposited in the openings 810 and over the top surfaces of the insulator layer 840 and top electrode plate 750. Openings 1062, 1064 are then formed from a top surface 1062 of the dielectric layer 960 to the composite bottom electrode 820 and the top electrode plate 750, respectively. For example, the openings 1062, 1064 may be formed by masking portions of dielectric layer 960 (e.g., using photoresist) corresponding to portions 1060 of dielectric layer 960 that are not to be removed, and selectively etching the unmasked portions of dielectric layer 960. Openings 1062, 1064 may be formed simultaneously or sequentially (e.g., using separate masking and etching processes). Either way, one or more etchants are used that are selective to the material of dielectric layer 960. In various embodiments, when forming opening 1064, the etching process may be terminated before removal of all of the material of top electrode plate 750 that is exposed through opening 1064 during the etching process. Alternatively, the selected etchant may not be selective to the material of top electrode plate 750. When forming opening 1062, the selected etchant may be selective to the material of insulator layer 840 and cap layer 830, so that portions of those layers are removed to expose the top surface of composite bottom electrode 820. In an alternate embodiment, the etchant may not be selective to the material of cap layer 830 or the etching process may be terminated before removal of all of the material of cap layer 830, so that a portion of cap layer 830 remains present at the bottom of opening 1062. In other embodiments, other methods of forming the openings 1062, 1064 may be used. During the process of forming openings 1062, 1064, one or more additional via openings (e.g., corresponding to via 1202, FIG. 12) may be formed between the top surface of dielectric layer 960 and the composite metal layer 520.

Referring to FIGS. 2 and 9-11, in block 216, top and bottom electrode contacts 1172, 1174 are then formed to produce MIM capacitor 1100. As mentioned previously, although electrode contacts 1172, 1174 may be implemented using non-filled, vertical via structures, as shown in the Figures, in other embodiments, either or both of the electrode contacts 1172, 1174 could be implemented using a different type of interconnect structure (e.g., a tapered non-filled via, a plug-filled via (e.g., a W-plug), a stacked via structure, or another type of interconnect structure). As also mentioned previously, although the Figures indicate that electrical connectivity to the composite bottom electrode 820 and the top electrode plate 750 may be made using interconnections with a higher metal layer, in still other alternate embodiments, electrical connectivity to the bottom electrode 820 (or to both the bottom electrode 820 and the top electrode plate 750) may be made using interconnections with lower metal layers.

According to an embodiment in which electrode contacts 1172, 1174 are implemented using non-filled, vertical via structures that provide electrical connectivity to a metal layer that is higher than the bottom electrode 820 and the top electrode plate 750, the top and bottom electrode contacts 1172, 1174 may be formed by depositing a conductive layer in the openings 1062, 1064 of dielectric layer 960 and over the top surface 1062 of the top dielectric layer 1060, and then patterning the conductive layer to form the top and bottom electrode contacts 1172, 1174. For example, the patterning process may include masking portions of the conductive layer (e.g., using photoresist) that correspond to the top and bottom electrode contacts 1172, 1174, and selectively etching the unmasked portions of the conductive layer. In other embodiments, other methods of forming the top and bottom electrode contacts 1172, 1174 may be used (e.g., selective deposition of the top and bottom electrode contacts 1172, 1174, rather than selective removal of portions of the conductive layer). The deposition and patterning process also may result in the formation of various additional conductive features, such as vias (e.g., via 1202, FIG. 12 between the conductive layer and underlying metal layers (e.g., composite metal layer 520, FIGS. 5, 12) and conductive traces over the top surface 1062 of the top dielectric layer. The conductive traces may constitute a metal routing layer 1170 of the device's routing and interconnect structure (e.g., one of metal layers M2, M3, M4, M5 or higher). The additional conductive features may serve to electrically connect the MIM capacitor 1100 with other circuit components.

Figure 12:
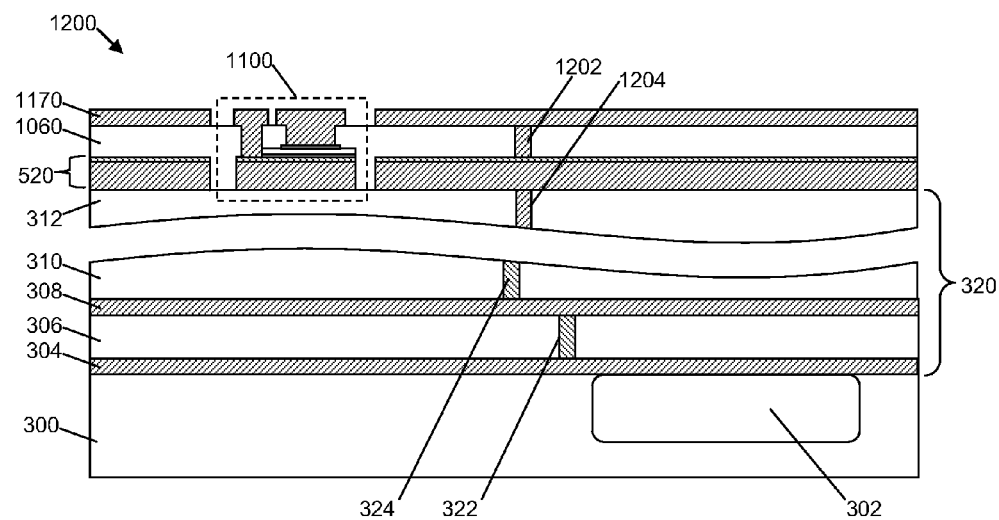
FIG. 12 is a cross-sectional, simplified, side view of an example of an integrated circuit device that includes one or more MIM capacitors electrically connected with other components of an integrated circuit device, in accordance with an example embodiment.

For example, FIG. 12 is a cross-sectional, simplified, side view of an example of an integrated circuit device 1200 that includes one or more MIM capacitors 1100 electrically connected with other components (e.g., component 302) of an integrated circuit device 1200, in accordance with an example embodiment. For example, MIM capacitor 1100 may be electrically connected with component 302 through the various metal routing layers 304, 308, 520, 1170 and vias 322, 324, 1202, 1204 of the integrated circuit device 1200. As mentioned previously, according to an embodiment, component 302 may be a p-channel or n-channel, RF LDMOS transistor. In another embodiment, component 302 may be another type of transistor or component. In still other embodiments, MIM capacitor 1100 may not be interconnected with any other components of an integrated circuit device (e.g., the integrated circuit device may include only MIM capacitor 1100 without other components, or MIM capacitor 1100 may simply be connected with bonding pads). Although only one MIM capacitor 1100 and one other component 302 are illustrated in FIG. 12, it is to be understood that the integrated circuit device 1200 may include one or more additional MIM capacitors, other integrated passive devices, and/or other components, as well.

Integrated circuit device 1200 ultimately may be incorporated into a larger electrical system. For example, in an embodiment, integrated circuit device 1200 may be incorporated into an RF electrical system, such as an RF power amplifier (e.g., a Doherty amplifier) which, in turn, forms a portion of an RF transmitter. In such an embodiment, MIM capacitor 1100 may form a portion of an input impedance matching network, an output impedance matching network, or some other capacitive component of the RF power amplifier circuit. Embodiments of MIM capacitors described and illustrated herein also may be incorporated into other types of circuits and systems, as well.

Embodiments of electronic devices and manufacturing methods have been described above. An embodiment of an integrated circuit includes an integrated passive device. The integrated passive device includes a composite electrode deposited over a semiconductor substrate, and an insulator layer deposited over the composite electrode. The composite electrode includes an underlying electrode and an overlying electrode deposited on a top surface of the underlying electrode. The underlying electrode is formed from a first conductive material, and the overlying electrode is formed from a second conductive material. The top surface of the underlying electrode has a relatively rough surface morphology, and a top surface of the overlying electrode has a relatively smooth surface morphology.

Another embodiment of an integrated circuit includes a MIM capacitor. The MIM capacitor includes a composite bottom electrode deposited over a semiconductor substrate, an insulator layer deposited over the composite bottom electrode, and a top electrode deposited over the insulator layer. The composite bottom electrode includes an underlying electrode and an overlying electrode deposited on a top surface of the underlying electrode. The underlying electrode is formed from a first conductive material, and the overlying electrode is formed from a second conductive material that is different from the first conductive material.

An embodiment of a method of manufacturing an integrated circuit includes forming an integrated passive device over a first dielectric layer. The integrated passive device is formed by forming a composite electrode over a semiconductor substrate, and forming an insulator layer over the composite electrode. The composite electrode includes an underlying electrode and an overlying electrode deposited on a top surface of the underlying electrode. The underlying electrode is formed from a first conductive material, and the overlying electrode is formed from a second conductive material that is different from the first conductive material.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing an integrated circuit, the method comprising the steps of:
    forming an integrated passive device over a first dielectric layer by
        forming a composite electrode over a semiconductor substrate, wherein the composite electrode includes an underlying electrode and an overlying electrode deposited on a top surface of the underlying electrode, wherein the underlying electrode is formed from a first conductive material that includes AlCuW, and the overlying electrode is formed from a second conductive material that is different from the first conductive material, and that includes AlCu, and
        forming an insulator layer over the composite electrode.

2. The method of claim 1, wherein forming the composite electrode comprises:
    depositing the underlying electrode on the first dielectric layer, wherein the underlying electrode has a thickness in a range of about 1.0 microns to about 2.0 microns; and
    depositing the overlying electrode on the top surface of the underlying electrode, wherein the overlying electrode has a thickness in a range of about 0.1 microns to about 0.3 microns.

3. The method of claim 1, wherein the integrated passive device is a metal-insulator-metal (MIM) capacitor, the composite electrode is a composite bottom electrode of the MIM capacitor, the insulator layer is an insulator of the MIM capacitor, and the method further comprises:
    forming a top electrode of the MIM capacitor over the insulator layer.

4. The method of claim 3, further comprising:
    forming a second dielectric layer over the top electrode;
    forming a first opening through the second dielectric layer that exposes a portion of the top electrode;
    forming a second opening through the second dielectric layer and the insulator layer that exposes a portion of the composite bottom electrode;
    forming a metal layer over the second dielectric layer; and
    patterning the metal layer to form a top electrode contact that extends through the first opening to contact the top electrode, and a bottom electrode contact that extends through the second opening to contact the composite bottom electrode.

5. The method of claim 3, further comprising:
    forming a laterally diffused metal oxide semiconductor transistor in the semiconductor substrate; and
    electrically coupling the laterally diffused metal oxide semiconductor transistor to the MIM capacitor.

6. An integrated circuit comprising:
    an integrated passive device that includes
        a composite electrode deposited over a semiconductor substrate, wherein the composite electrode includes an underlying electrode and an overlying electrode deposited on a top surface of the underlying electrode, wherein the underlying electrode is formed from a first conductive material that includes AlCuW, and the overlying electrode is formed from a second conductive material that includes AlCu, and wherein the top surface of the underlying electrode has a relatively rough surface morphology, and a top surface of the overlying electrode has a relatively smooth surface morphology; and
        an insulator layer deposited over the composite electrode.

7. The integrated circuit of claim 1, wherein the composite electrode has a thickness in a range of about 1.0 microns to about 2.0 microns.

8. The integrated circuit of claim 1, wherein:
    the underlying electrode has a thickness in a range of about 1.0 microns to about 2.0 microns; and
    the overlying electrode has a thickness in a range of about 0.1 microns to about 0.3 microns.

9. The integrated circuit of claim 1, wherein the insulator layer is formed from a material selected from a plasma enhanced nitride and a plasma enhanced oxide.

10. The integrated circuit of claim 1, wherein the insulator layer has a thickness in a range of about 1500 angstroms to about 2500 angstroms.

11. The integrated circuit of claim 1, wherein the integrated passive device is a metal-insulator-metal (MIM) capacitor, the composite electrode forms a composite bottom electrode of the MIM capacitor, the insulator layer forms an insulator of the MIM capacitor, and the MIM capacitor further comprises:
    a top electrode over the insulator layer.

12. The integrated circuit of claim 11, wherein the top electrode is formed from one or more materials selected from Ti and TiN.

13. The integrated circuit of claim 11, wherein the insulator layer includes an opening that exposes a portion of the composite bottom electrode, the integrated passive device further comprising:
    a patterned dielectric layer over the top electrode, wherein the patterned dielectric layer includes a first opening that exposes a portion of the top electrode and a second opening aligned with the opening in the insulator layer; and
    a patterned metal layer over the patterned dielectric layer, wherein the patterned metal layer includes a top electrode contact that extends through the first opening to contact the top electrode, and a bottom electrode contact that extends through the second opening and the opening in the insulator layer to contact the composite bottom electrode.

14. An integrated circuit comprising:
    a metal-insulator-metal (MIM) capacitor that includes
        a composite bottom electrode deposited over a semiconductor substrate, wherein the composite bottom electrode includes an underlying electrode and an overlying electrode deposited on a top surface of the underlying electrode, wherein the underlying electrode is formed from a first conductive material that includes AlCuW, and the overlying electrode is formed from a second conductive material that is different from the first conductive material, and that includes AlCu;

an insulator layer deposited over the composite bottom electrode; and a top electrode deposited over the insulator layer.

15. The integrated circuit of claim 14, wherein the composite bottom electrode has a thickness in a range of about 1.0 microns to about 2.0 microns.

16. The integrated circuit of claim 14, wherein:

the underlying electrode has a thickness in a range of about 1.0 microns to about 2.0 microns; and the overlying electrode has a thickness in a range of about 0.1 microns to about 0.3 microns.

17. The integrated circuit of claim 14, further comprising:

a laterally diffused metal oxide semiconductor transistor electrically coupled to the MIM capacitor.

\* \* \* \* \*